United States Patent
Chung et al.

(10) Patent No.: US 6,922,050 B2
(45) Date of Patent: Jul. 26, 2005

(54) METHOD FOR TESTING A REMNANT BATCH OF SEMICONDUCTOR DEVICES

(75) Inventors: Ae-yong Chung, Chungcheongnam-do (KR); Sung-ok Kim, Chungcheongnam-do (KR); Jeong-ho Bang, Gyeonggi-do (KR); Kyeong-seon Shin, Gyeonggi-do (KR); Dae-gab Chi, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 10/835,143

(22) Filed: Apr. 28, 2004

(65) Prior Publication Data

US 2004/0253753 A1 Dec. 16, 2004

(30) Foreign Application Priority Data

May 7, 2003 (KR) .................... 10-2003-0028875

(51) Int. Cl.$^7$ .............................................. G01R 31/02
(52) U.S. Cl. ..................................... 324/158.1; 324/765
(58) Field of Search ................... 324/73.1, 754–755, 324/765, 158.1; 414/416, 422, 783, 940; 209/573; 702/117–118, 120

(56) References Cited

U.S. PATENT DOCUMENTS

| | | | | |
|---|---|---|---|---|
| 5,307,011 A | * | 4/1994 | Tani | 324/158.1 |
| 6,163,146 A | * | 12/2000 | Suzuki et al. | 324/158.1 |
| 6,384,593 B1 | * | 5/2002 | Kobayashi et al. | 324/158.1 |
| 6,728,652 B1 | * | 4/2004 | Kobayashi | 702/117 |

* cited by examiner

Primary Examiner—Minh N. Tang
(74) Attorney, Agent, or Firm—Marger Johnson & McCollom, P.C.

(57) ABSTRACT

A method for testing semiconductor devices includes loading a customer tray with semiconductor devices to be tested. Groups of devices are transferred from the customer tray to buffer trays for testing. The number of devices in the customer tray is checked after each transfer. If the customer tray is empty, the number of semiconductor devices in the buffer trays is counted and compared with the number of semiconductor devices that can be tested simultaneously, typically either 64 or 128. If the number of semiconductor devices in the buffer trays is greater than the tester capacity, the semiconductor devices in at least one buffer tray are tested. If the number of semiconductor devices in the buffer trays is smaller than the tester capacity, semiconductor devices that were determined to be low quality in a prior test are loaded into a buffer tray, thus testing both untested and low quality devices together.

12 Claims, 4 Drawing Sheets

METHOD FOR TESTING A REMNANT BATCH OF SEMICONDUCTOR DEVICES

BACKGROUND OF THE INVENTION

This application claims the priority of Korean Patent Application No. 2003-28875, filed on May 7, 2003, in the Korean Intellectual Property Office, the disclosure of which is incorporated herein in its entirety by reference.

1. Field of the Invention

The present invention relates to a method for testing semiconductor devices, and more particularly, to a method for efficiently testing a remnant batch of semiconductor devices.

2. Description of the Related Art

Testers generally test the quality of semiconductor devices (referred to as semiconductor integrated circuits (ICs) and are automated devices that operate under the control of a programmed computer. The testers load the semiconductor devices to be tested into a test tray, transfer the semiconductor devices in the test tray to a test site, electrically test the semiconductor devices in the test tray at the test site, classify them into high and low quality semiconductor devices, and remove the classified semiconductor devices from the test site.

The testers also include a transfer unit (hereinafter referred to as a handler) that transfers the semiconductor devices to be tested. The handler transfers the semiconductor devices to the test site, electrically connects the semiconductor devices to a socket in a test head, and removes the tested semiconductor devices from the test site according to the quality of the semiconductor devices.

As semiconductor memory devices, such as dynamic random access memories (DRAMs), tend toward large capacity and multiple pins, the development of testers used for the semiconductor memory devices has put an emphasis on throughput. It takes considerable time to electrically test semiconductor devices that have large capacities. As a result, testing costs more. To solve this problem, testers for the semiconductor memory devices generally have use a parallel test method. The parallel test method tests a plurality of semiconductor devices simultaneously rather than each in sequence. At present, parallel test methods for simultaneously testing 64 or 128 semiconductor DRAMs are feasible.

In a conventional test method, 64 or 128 semiconductor devices to be tested are loaded into a test tray for a test. But devices that test as low quality are retested, even if only one such semiconductor device is loaded into a test tray. As a result, the testers operate at less than full capacity, and efficiency is impaired.

SUMMARY OF THE INVENTION

A method for testing semiconductor devices comprises: (a) loading a first tray with over n devices for testing, where n is the number of semiconductor devices that can be accommodated in a test tray; (b) loading n devices from the first tray into the test tray; (c) connecting the devices in the test tray to a tester; (d) testing the devices; (e) classifying the tested devices into high quality and low quality devices; (f) unloading the classified devices from the test tray; (g) if the first tray has greater than n devices, repeating steps (b) through (f); and (h) if the first tray has fewer than n devices, loading the low quality devices into the first tray; loading the remaining devices up to n from the first tray into the test tray; and repeating steps (c) through (f).

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

Figure 1:
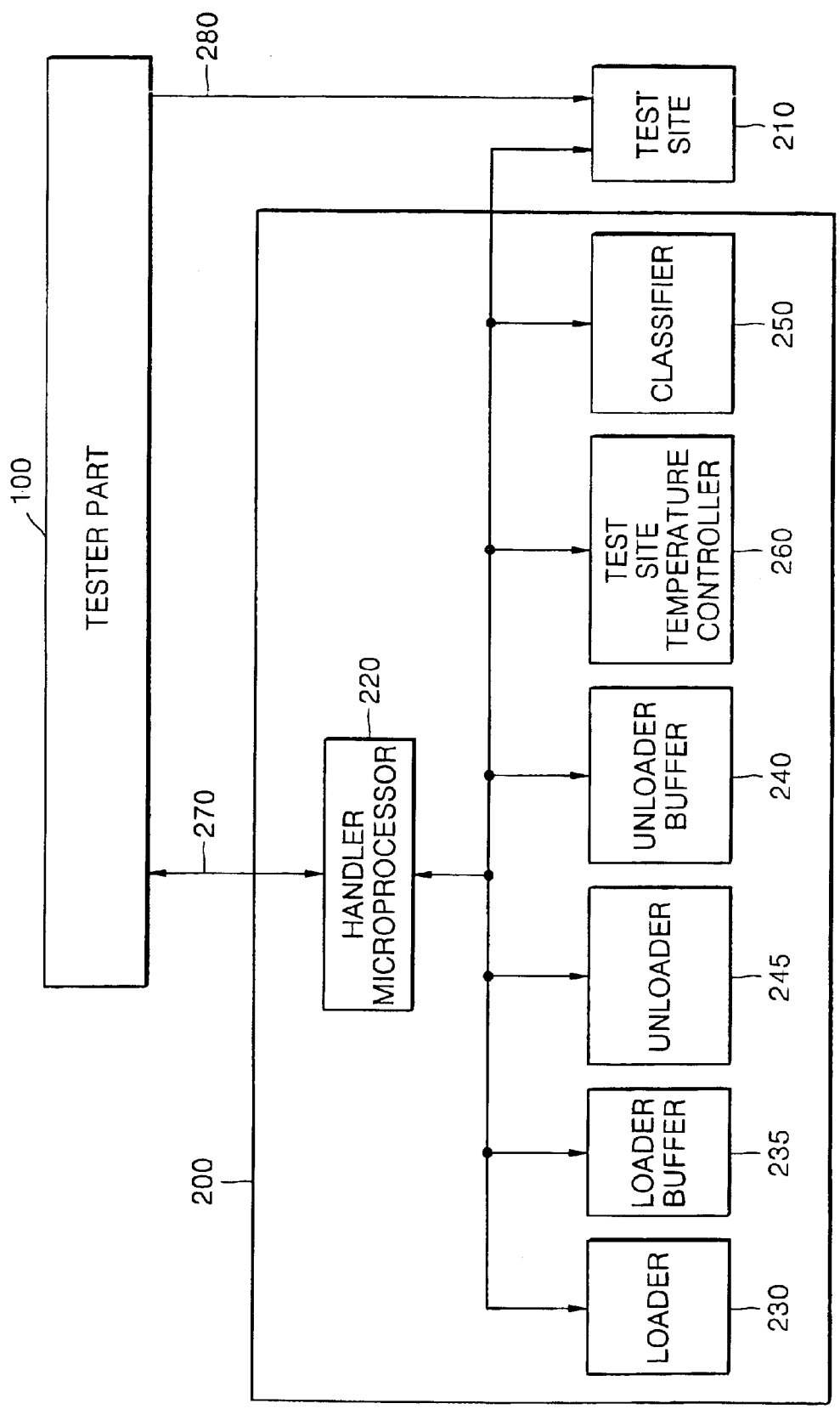
FIG. 1 is a schematic view of a tester adapted to a method for testing a semiconductor device, according to the present invention.

FIG. 1 is a schematic view of a tester adapted to perform a method for testing a semiconductor device according to the present invention. Referring to FIG. 1, the tester includes a tester part 100 and a handler 200, which is connected to the tester part 100. The handler 200 is an automatic robot that is independently controlled by a handler microprocessor 220, which communicates with a microprocessor (not shown) in the tester part 100.

The handler 200 includes a loader 230 that loads semiconductor devices to be tested thereinto. The semiconductor devices located in the loader 230 are transferred to a test site 210 via a loader buffer 235. The tested semiconductor devices are transferred out of handler 200 via an unloader buffer 240 and an unloader 245. The handler 200 further includes a classifier 250, which receives an electrical test result from the tester part 100 via an information signal cable 270. This signal classifies semiconductor devices into high and low quality semiconductor devices.

A test site temperature controller 260 controls the temperature of the test area for the semiconductor devices. For instance, controller 260 may set the temperature of the test site 210 into high, ambient, and low temperature states to examine whether the semiconductor devices function properly regardless of variations in the temperature. The test site 210 electrically connects the semiconductor devices to be tested to the tester part 100 via a board (not shown) and communicates with the tester part 100 via a test signal cable 280.

After the handler 200 is connected to the tester part 100 via the information signal cable 270 and the test signal cable 280, it loads the semiconductor devices to be tested thereinto. It then connects the semiconductor devices in sockets of the board in the test site 210, and transmits a test start signal to the tester part 100. Next, when the handler 200 receives a test end signal from the tester part 100, the handler 200 classifies the semiconductor devices according to a test result that has been received along with the test end signal, and disconnects the semiconductor devices from the sockets.

Figure 2:
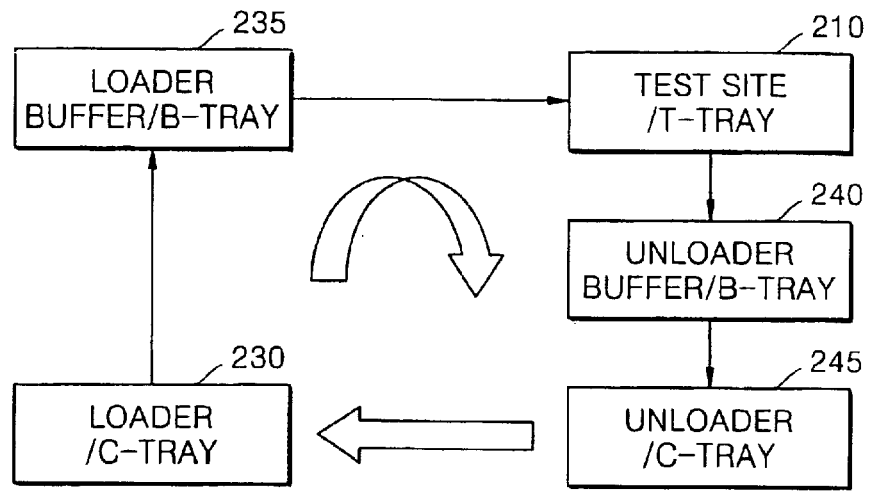
FIGS. 2 and 3 are block diagrams for explaining the transfer of semiconductor devices to be tested using the method.
Figure 3:
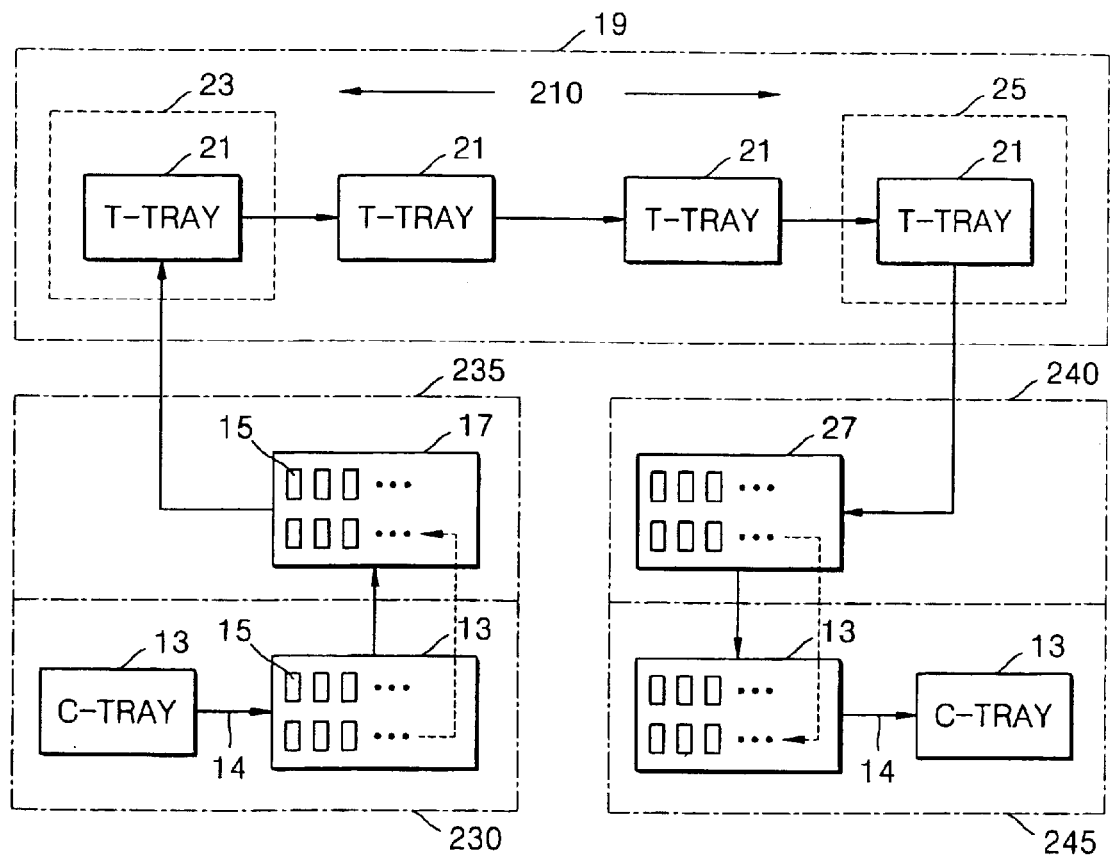

FIGS. 2 and 3 are block diagrams for illustrating the process of transferring semiconductor devices to be tested using the method. Referring to FIGS. 2 and 3, a customer tray (C-tray) 13 into which a user has loaded a plurality of semiconductor devices 15 to be tested is loaded into the loader 230 of the handler 200. The number of semiconductor devices 15 to be tested loaded into the C-tray 13 depends on the conditions of the C-tray 13 and the user, but it may be many hundreds of devices. The C-tray 13 loaded into the loader 230 moves to a suitable position to transfer the semiconductor devices 15 to the loader buffer 235 via a transfer arm 14.

The semiconductor devices 15 are transferred from the C-tray 13 to a buffer tray (B-tray) 17 of the loader buffer 235. In the present implementation, 96 semiconductor devices to be tested are loaded into the buffer tray 17, and the loader buffer 235 includes ten sheets of B-trays 17.

The semiconductor devices 15 are transferred from the B-tray 17 of the loader buffer 235 to a test tray (T-tray) 21 positioned in a constant temperature chamber 19. The T-tray 21 can receive up to 64 semiconductor devices at a time. A soak chamber 23 includes, in the present embodiment, 10 T-trays 21. In the soak chamber 23, the semiconductor devices 15 in the T-tray 21 are heated or cooled at a predetermined temperature.

The T-tray 21. including the heated or cooled semiconductor devices 15. is transferred to the test site 210 and then tested. In the test site 210 one or two T-trays 21 are tested simultaneously thereby simultaneously testing 64 or 128 semiconductor devices 15, depending upon the capacity of the tester. The T-tray 21 including the tested semiconductor devices 15 is transferred to an exit chamber 25 so that the semiconductor devices 15 return to an external temperature.

The tested semiconductor devices 15 are classified according to the test result obtained in the test site 210 and transferred to a B-tray 27 of the unloader buffer 240. Next, the tested semiconductor devices 15 are transferred from the B-tray 27 of the unloader buffer 240 to the C-tray 13 of the unloader 245. When the C-tray 13 in the unloader 245 moves to a proper position via the transfer arm 14 to unload the semiconductor devices 15 from the unloader 245, the test process is finished for those devices that are classified high quality. But the semiconductor devices 15 that have been classified as low quality semiconductor devices in the test site 210 are transferred to the C-tray 13 of the loader 230 and undergo the test process again.

Figure 4A:
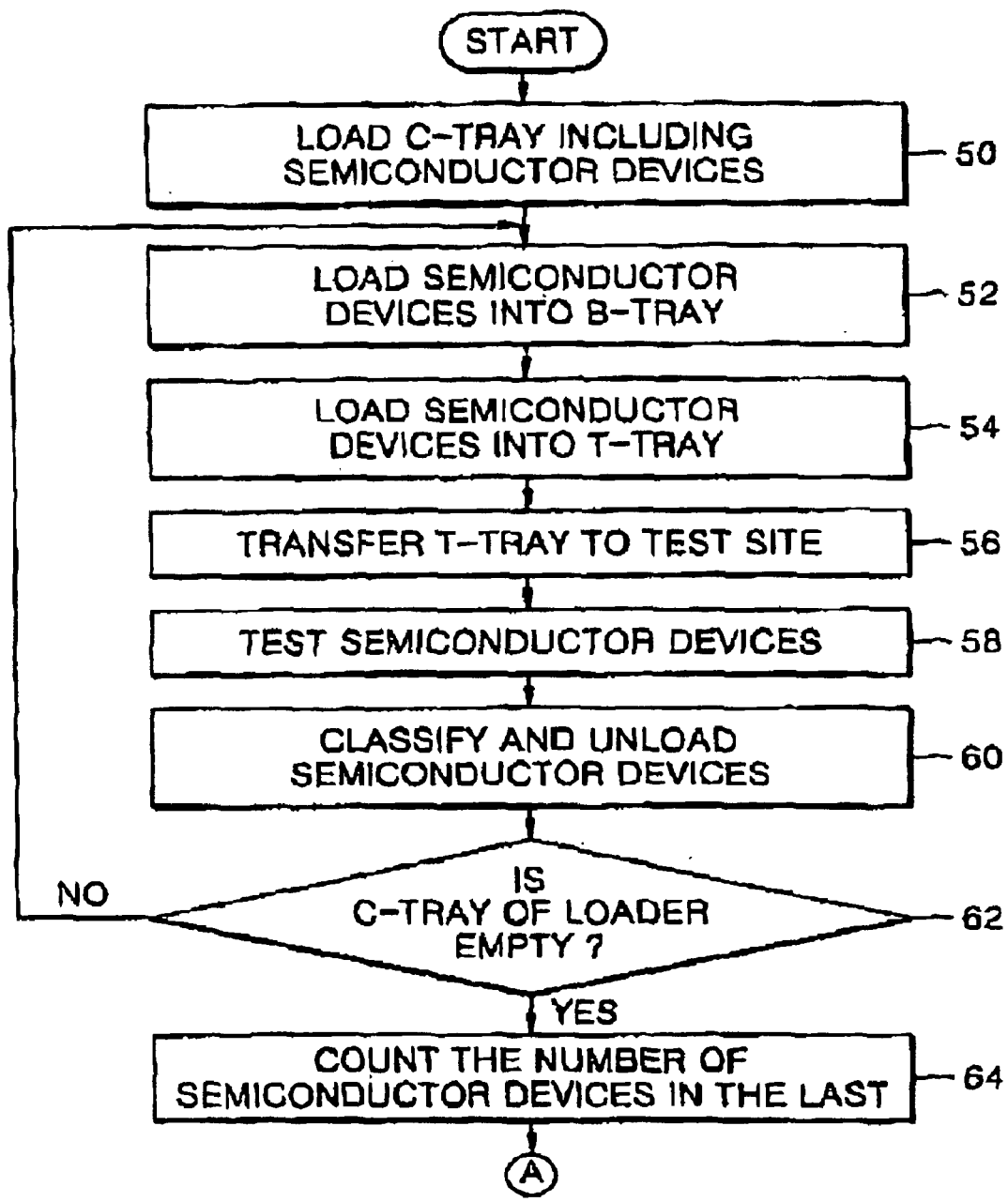
FIGS. 4A and 4B are flowcharts for explaining the method.
Figure 4B:
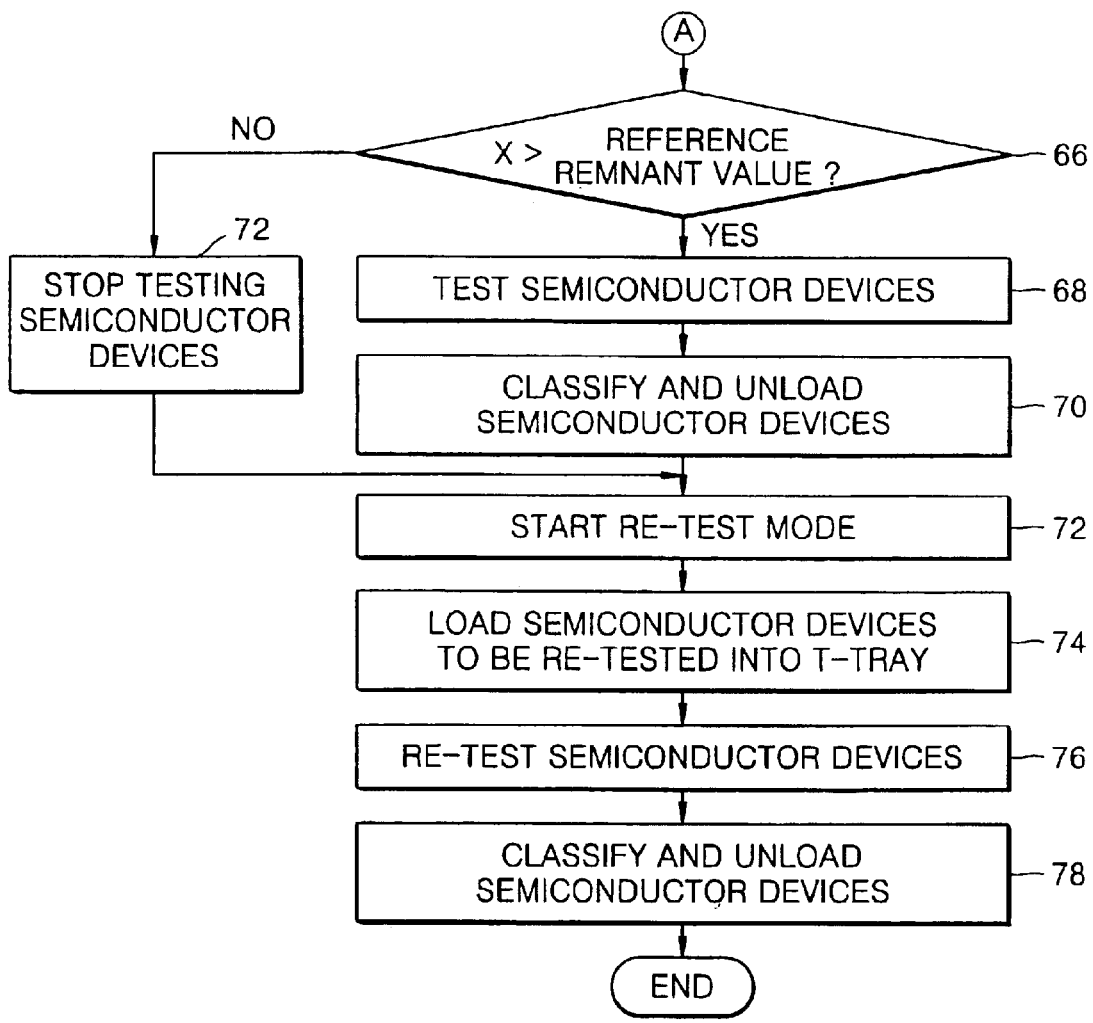

FIGS. 4A and 4B are flowcharts for explaining the method. Referring to FIG. 4, in step 50, a C-tray into which a plurality of semiconductor devices to be tested is loaded into a loader. As previously described, the number of the semiconductor devices loaded into the C-tray depends on the capacity of the C-tray and the number of devices that need to be tested.

In step 52, the semiconductor devices are transferred from the C-tray of the loader to a B-tray of a loader buffer. As previously described, 96 semiconductor devices are loaded into one B-tray, and the loader buffer includes ten sheets of B-trays.

In step 54, the semiconductor devices are transferred from the B-tray of the loader buffer to a T-tray of a soak chamber in a constant temperature chamber. As previously described, 64 semiconductor devices are loaded into the T-tray at a time. The soak chamber includes 10 T-trays. In the soak chamber, the semiconductor devices in the T-tray are heated or cooled at a predetermined temperature.

In step 56, the T-tray including the semiconductor devices moves to a test site. In step 58, the devices in the T-tray are tested. As previously described, one or two T-trays are simultaneously tested in the test site thus testing either 64 or 128 semiconductor devices, depending on the capacity of the tester. In step 60, the tested semiconductor devices are classified into high and low quality semiconductor devices and then unloaded from the T-tray to the C-tray of an unloader via an unloader buffer.

In step 62, a determination is made as to whether the C-tray of the loader is empty. If in step 62, it is determined that the C-tray of the loader is not empty, steps 52 through 60 are repeated.

If in step 62, it is determined that the C-tray of the loader is empty, in step 64, the number of semiconductor devices in the last B-tray of the loader buffer is counted. These devices are referred to herein as remnants or a remnant batch. In step 66, the number of semiconductor devices in the last B-tray of the loader buffer is compared with the capacity of the tester, which is typically either 64 or 128.

If in step 66, it is determined that the number of semiconductor devices in the last B-tray is greater than the tester capacity, in step 68, the semiconductor devices in the B-tray of the loader are transferred to the T-tray and tested. In step 70, the tested semiconductor devices are classified into high and low quality semiconductor devices via the unloader buffer and then unloaded from the T-tray.

If in step 66, however, it is determined that the number of semiconductor devices in the last B-tray is smaller than the tester capacity, in step 72, remnant semiconductor devices in the last B-tray are not transferred to the T-tray and the process stops temporarily.

In step 72, the tester starts a re-test mode. Next, the semiconductor devices that have been classified as being low quality in the test site are transferred to the C-try of the loader. Thereafter, the low quality semiconductor devices are loaded into the B-tray that includes the remnant semiconductor devices and then into the T-tray with the remnant devices. In other words, the low quality semiconductor devices as well as the remnant semiconductor devices are loaded into the T-tray so that the number of semiconductor devices to be tested is increased up to 64 or 128, depending on the capacity of the tester.

In step 74, the semiconductor devices, including the low quality devices that have already been tested once, are loaded into the T-tray are tested in the test site. In step 76, the tested semiconductor devices are classified into high and low quality semiconductor devices via the unloader buffer and then unloaded from the T-tray.

As described above, according to the present invention the number of tests run on a batch of semiconductor devices is reduced because the last test load or two includes both devices that are being tested for the first time as well as some that are being retested, thus increasing throughput of the tester.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method for testing semiconductor devices, comprising:

loading a customer tray comprising semiconductor devices to be tested in a loader;

loading the semiconductor devices into a test tray via a buffer tray of a loader buffer;

classifying the tested semiconductor devices into high and low quality semiconductor devices and unloading the classified semiconductor devices from the test tray;

determining whether the customer tray is empty;

if it is determined that the customer tray is not empty, testing the semiconductor devices in a tester;

if it is determined that the customer tray is empty, counting the number of semiconductor devices in the buffer tray;

comparing the number of semiconductor devices in the buffer tray with the capacity of the tester;

if the number of semiconductor devices in the buffer tray is greater than the capacity of the tester, testing the semiconductor devices in the buffer tray; and if the number of semiconductor devices in the buffer tray is smaller than the capacity of the tester, loading the low quality semiconductor devices into the buffer tray for testing.

2. The method for claim 1, wherein the loader buffer comprises a plurality of buffer trays.

3. The method for claim 2, wherein when the customer tray is empty, the number of semiconductor devices in the last buffer tray buffer is counted.

4. The method for claim 1, wherein the capacity is 64 or 128.

5. The method for claim 1, wherein the method further comprises:

transferring the low quality semiconductor devices to the customer tray;

loading the low quality semiconductor devices from the customer tray into the buffer tray; and loading both tested and untested semiconductor devices from the buffer tray into the test tray for testing.

6. A method for testing semiconductor devices, comprising:

loading a customer tray comprising semiconductor devices to be tested into a loader;

loading the semiconductor devices from the customer tray into a buffer tray of a loader buffer;

loading the semiconductor devices from the buffer tray into a test tray to test the semiconductor devices;

unloading the tested semiconductor devices to a customer tray of an unloader via an unloader buffer according to quality of the semiconductor devices;

determining whether the customer tray is empty;

if it is determined that the customer tray is not empty, testing the semiconductor devices;

if it is determined that the customer tray is empty, counting the number of semiconductor devices in the buffer tray;

comparing the number of semiconductor devices in the buffer tray with a reference remnant value which has already been input to a tester;

if the number of semiconductor devices in the buffer tray is greater than the reference remnant value, testing the semiconductor devices in the buffer tray;

if the number of semiconductor devices in the buffer tray is smaller than the reference remnant value, stopping testing the semiconductor devices;

starting a re-test mode;

transferring the low quality semiconductor devices to the customer tray; and loading the low quality semiconductor devices into the buffer way comprising remnant semiconductor devices to re-test the low quality and remnant semiconductor devices.

7. The method for claim 6, wherein the reference remnant value is 64 or 128.

8. A method for testing semiconductor devices comprising:

(a) loading a first tray with over n devices for testing, where n is the number of semiconductor devices that can be accommodated in a test tray;

(b) loading n devices from the first tray into the test tray;

(c) connecting the devices in the test tray to a tester;

(d) testing the devices;

(e) classifying the tested devices into high quality and low quality devices;

(f) unloading the classified devices from the test tray;

(g) if the first tray has greater than n devices, repeating steps (b) through (f); and (h) if the first tray has fewer than n devices,
loading the low quality devices into the first tray;
loading the remaining devices up to n from the first tray into the test tray; and
repeating steps (c) through (f).

9. The method for claim 8 wherein the first tray comprises a buffer tray and wherein said method further comprises moving the semiconductor devices from a customer tray to the buffer tray.

10. The method for claim 9 wherein said method further comprises determining whether the buffer tray has greater than n devices in response to determining that the customer tray is empty.

11. The method for claim 8 where n equals 64.

12. The method for claim 11 wherein said method further comprises loading n additional devices from the first tray into a second test tray.

* * * * *

UNITED STATES PATENT AND TRADEMARK OFFICE
CERTIFICATE OF CORRECTION

PATENT NO.       : 6,922,050 B2                                                Page 1 of 1
APPLICATION NO.  : 10/835143
DATED            : July 26, 2005
INVENTOR(S)      : Chung et al.

It is certified that error appears in the above-identified patent and that said Letters Patent is hereby corrected as shown below:

At column 1, line 41, please replace "have use a parallel" with --have used a parallel --

At column 3, line 25, please replace "devices 15. is" with --devices 15 is--

At column 4, line 33, please replace "c-try" with -- c-tray--

At column 6, line 16, please replace "the buffer way" with --the buffer tray--

Signed and Sealed this

Fifth Day of September, 2006

JON W. DUDAS
*Director of the United States Patent and Trademark Office*